United States Patent [19]

Calcatera et al.

[11] Patent Number: 5,448,085
[45] Date of Patent: Sep. 5, 1995

[54] LIMITED CURRENT DENSITY FIELD EFFECT TRANSISTOR WITH BURIED SOURCE AND DRAIN

[75] Inventors: Mark C. Calcatera, Spring Valley, Ohio; Dennis L. May, Novinger, Mo.

[73] Assignee: The United States of America as represented by the Secretary of the Air Force, Washington, D.C.

[21] Appl. No.: 289,337

[22] Filed: Aug. 11, 1994

Related U.S. Application Data

[63] Continuation of Ser. No. 44,444, Apr. 5, 1993, abandoned.

[51] Int. Cl.$^6$ ............... H01L 27/085; H01L 29/44; H01L 29/784
[52] U.S. Cl. ................... 257/192; 257/194; 257/29; 257/401
[58] Field of Search ............ 257/192, 275, 604, 192, 257/194, 408, 335, 336, 337, 338, 344, 24, 27, 29; 333/262, 81 A

[56] References Cited

U.S. PATENT DOCUMENTS

| | | |
|---|---|---|
| 4,769,338 | 9/1988 | Ovshinsky et al. ............ 437/39 |
| 4,782,032 | 11/1988 | Geissberger et al. ........... 437/41 |
| 4,786,610 | 11/1988 | Blossfeld ..................... 437/31 |
| 4,843,024 | 6/1989 | Ito ........................... 437/41 |
| 4,868,135 | 9/1989 | Ogura et al. .................. 437/31 |
| 4,956,308 | 9/1990 | Griffin et al. ................ 437/41 |
| 4,962,054 | 10/1990 | Shikata ....................... 257/192 |
| 4,963,501 | 10/1990 | Ryan et al. ................... 257/192 |
| 5,021,361 | 6/1991 | Kinoshita et al. .............. 437/129 |
| 5,086,321 | 2/1992 | Batey et al. .................. 257/192 |
| 5,101,245 | 3/1992 | Shimura ....................... 257/194 |

Primary Examiner—Rolf Hille
Assistant Examiner—Wael M. Fahmy
Attorney, Agent, or Firm—Gerald B. Hollins; Thomas L. Kundert

[57] ABSTRACT

A buried source and drain microwave field effect transistor which provides reduced current density and reduced electric field intensity near the transistor's surface region is disclosed. Operating life and reliability of the transistor are improved by the buried source and drain structure which locates necessary regions of high electrical field intensity and large current density well within the body of the transistor. Comparisons of the buried source and drain field effect transistor with the conventional metal semiconductor field effect transistor are disclosed and include current density, electric field intensity, voltage potentials and I-V curve comparisons. A salient steps fabrication sequence for the buried source and drain field effect transistor is also disclosed.

19 Claims, 5 Drawing Sheets

LIMITED CURRENT DENSITY FIELD EFFECT TRANSISTOR WITH BURIED SOURCE AND DRAIN

RIGHTS OF THE GOVERNMENT

The invention described herein may be manufactured and used by or for the Government of the United States for all governmental purposes without the payment of any royalty.

This application is a continuation of application Ser. No. 08/044,444, now abandoned filed on Apr. 5,1993.

BACKGROUND OF THE INVENTION

This invention relates to the field of solid state electronic devices and more precisely to the field effect transistor art.

An important factor in many metal-semiconductor field effect transistor (MESFET) failure mechanisms has been determined to concern the location of and the magnitude of current crowding, near the top surface of the semiconductor material.

The geometry of a MESFET, coupled with standard active layer doping profiles, produce current crowding regions in at least two distinct areas near the surface of such device. This current crowding occurs on the leading edges of the source and drain elements or electrodes and if a recessed gate arrangement is used, current crowding also occurs on both sides of the gate. These current crowding areas are known to cause or contribute to surface related failure mechanisms including material migration, heat stresses, voltage breakdown, and other near surface deleterious phenomena.

The proximity of such currents to the transistor surface also makes careful surface preparation a necessity during transistor fabrication in order to limit the influence of current crowding-related failure mechanisms. This extra surface preparation activity leads of course, to lowered process yields and increased fabrication complexity. Some electronic devices, such as diodes, have in fact, shown that GaAs and other semiconductor materials will allow higher electric fields and power densities in their bulk regions than their best achievable surfaces will tolerate.

The patent art includes several examples of transistor structures which are of general background interest with respect to the present invention. Included in this art is the U.S. Pat. No. 4,769,338 of S. R. Ovshinsky et al which is concerned with a thin film field effect transistor and its fabrication. The transistor of the Ovshinsky et al invention differs from that of the present invention in its use of source and drain electrodes which are deposited over the semiconductor channel element in contrast with an underlying relationship for these elements in the present invention.

The patent art of interest also includes U.S. Pat. No. 4,782,032, issued to A. E. Geissberger et al, which is concerned with a fabrication arrangement for a self-aligned gallium arsenide transistor having a special Twin Gate interconnect arrangement. The Geissberger et al transistor is also not of the buried source and drain variety and in addition employs self aligned side contact members. Thereby the Geissberger transistor is distinguished from the transistor of the present invention.

The patent art of interest also includes U.S. Pat. No. 4,786,610 of L. Blossfeld which is concerned with a fabrication arrangement for an integrated circuit which employs a bipolar planar transistor having ion implanted N impurities. The absence of a field effect transistor in this integrated circuit distinguishes the present invention from the Blossfeld invention.

The patent art of interest also includes U.S. Pat. No. 4,843,024 which is issued to K. Ito and is concerned with a method for producing a Schottky gate field effect transistor including N+ regions formed by an ion implantation. The transistor of the Ito invention has a degree of similarity to the Geissberger et al transistor described above and does not employ the buried source and drain arrangement of the present invention.

The patent art of interest also includes U.S. Pat. No. 4,868,135 issued to S. Ogura et al and concerned with a method for fabricating a Bi-CMOS transistor device. The Ogura et al transistor employs an epitaxial or epi N layer and achieves a MOSFET type of transistor; however, the source and drain electrodes in this transistor are not of the buried type as in the present invention.

The patent art of interest also includes U.S. Pat. No. 4,962,054 issued to S. Shikata which is concerned with a method for fabricating a field effect transistor which employs spacers of differing thickness. The Shikata transistor employs a dissimilar drain to gate vs. source to gate spacing interval and is achieved with a self aligned fabrication arrangement that is similar to the Geissberger et al and Ito patents discussed above, but also does not employ a buried source and drain arrangement.

Also included in the patent art of general interest is U.S. Pat. No. 4,963,501 issued to F. J. Ryan et al. The Ryan patent is concerned with a method for fabricating semiconductor devices having submicron line widths. The Ryan et al transistor is also a self aligned device which uses substitutional gate processing, but is not of the buried source and drain arrangement included in the present invention.

The patent art of general interest also includes U.S. Pat. No. 4,956,308 issued to E. L. Griffin et al; this patent is concerned with the method for fabricating self aligned field effect transistors. As with the Geissberger et al and Ito transistors the Griffin et al transistor is not of the buried source and drain variety as in the present invention.

Also included in this patent art is U.S. Pat. No. 5,021,361 issued to J. Kinoshita et al which is concerned with the fabrication of a combination field effect transistor and opto-electronic device. The transistor of the Kinoshita et al invention is also of the top contact or overlaying source and drain type rather than the buried source and drain structure of the present invention.

These examples of prior transistor arrangements are therefore of the conventional metal-semiconductor field effect transistor (MESFET) type which employ overlaying source and drain locations or of the implanted MESFET type wherein implanted source and drain regions reside at the side of an epi layer.

SUMMARY OF THE INVENTION

The present invention is concerned with a metal-semiconductor field effect transistor (MESFET), for example, in which the source and drain electrodes are first in time of fabrication and are disposed below the carrier transport channel region in the transistor structure. This buried source and drain configuration is shown to offer a disposition of maximum current density in a more desirable subsurface location of the transistor where the deleterious effects of imperfect surface crystal structure and other surface phenomena are absent. The absence of combined imperfect surface conditions, high current density, and electric field values in these imperfect surface adjacent areas of the transistor provide improved performance and decreased fabrication complexity for the achieved transistor.

An object of the present invention is therefore to provide an improved power amplification transistor device.

Another object of the invention is to provide a microwave power amplifier device capable of high voltage and high power operation.

Another object of the invention is to provide a microwave power amplifier device capable of improvements in device processing yield.

Another object of the invention is to provide a microwave power amplifier device capable of improved reliability.

Another object of the invention is to provide a microwave power amplifier device capable of reduced surface effect voltage breakdown.

Another object of the invention is to provide a microwave power amplifier device capable of reduced material migration and other surface failure mechanisms.

Another object of the invention is to place current crowding regions of the achieved FET deep in the device and thereby reduce thermal stresses and provide improved heat removal.

Another object of the invention is to provide a microwave power amplifier device capable of divorced physical locations for regions of high electric field intensity and regions of high current density.

Another object of the invention is to provide a planar field effect transistor configuration of low surface region current density a configuration that is useful in junction field effect (JFET), metal oxide semiconductor field effect (MOSFET), metal insulator field effect (MISFET), high electron mobility (HEMT) and other transistor arrangements.

Additional objects and features of the invention will be understood from the following description and claims and the accompanying drawings.

These and other objects of the invention are achieved by buried source and drain metal semiconductor field effect transistor apparatus of low surface current density and physically divorced intense electric field and high current density locations comprising the combination of:

a semi-insulating semiconductor substrate member;

source and drain members received in predetermined physical extent dimension and physical separation distance in said substrate member, said source and drain members being comprised of said semi-insulating substrate material having a first concentration of a first dopant material disposed therein;

a layer of semiconductor material, including a second dopant material at a second concentration, disposed over said substrate member and said source and drain members therein, with source and drain member overlaying portions of said layer of semiconductor material comprising source current conducting and drain current conducting connector members respectively;

an intermediate region of said layer of semiconductor material, a region resident overlaying said source and drain members and residing between said source and drain connector members, comprising a gate controlled carrier transport channel region for charge carriers flowing between said source and drain electrodes of said transistor;

source and drain metallic contact members each received in overlaying relationship with a respective one of said source and drain currents conducting connector members and in contiguous connection therewith;

a gate metallic contact member received in overlaying relationship with a gate element portion of said carrier transport channel region of said semiconductor material layer; and means for electrically connecting said metallic contact members with externally disposed sources of electrical energy, signal source, and signal utilization.

DETAILED DESCRIPTION

Conventional metal-semiconductor field effect transistors (MESFETs) have surface oriented source and drain contacts. In recessed gate FETs, this geometry coupled with standard doping profiles or epitaxial layering produces current crowding and current flow hot spots in four distinct transistor regions. These regions are located on the surface near the source and drain leading edges and on both sides of the gate element near the surface. These high current areas near the surface are known to promote voltage breakdown, semiconductor material migration, and other unfortunate failure mechanisms. Similar effects are to be found in other planar field effect transistors in addition to the MESFET, devices such as the metal oxide semiconductor field effect transistor or MOSFET device, the junction field effect transistor or JFET device, the metal insulator semiconductor or MISFET device and the high energy electron mobility transistor or HEMT device, all of which devices and other related structures are subject to the improvements afforded by the present invention.

Bulk GaAs material for example, is known to be capable of operating at higher electric fields and power densities than surface-effect dominated FETs will allow. The present invention therefore places N+ regions as the source and drain elements below the channel region of the transistor such that the FET can operate without this undesirable current crowding near its surface. The areas of high current density in the resulting transistor are deeply recessed into the bulk material so as to negate surface related material migration phenomena or breakdown mechanisms. The N+ regions of the source and drain extend sideways toward the gate, which is not recessed in this transistor arrangement.

Figure 1:
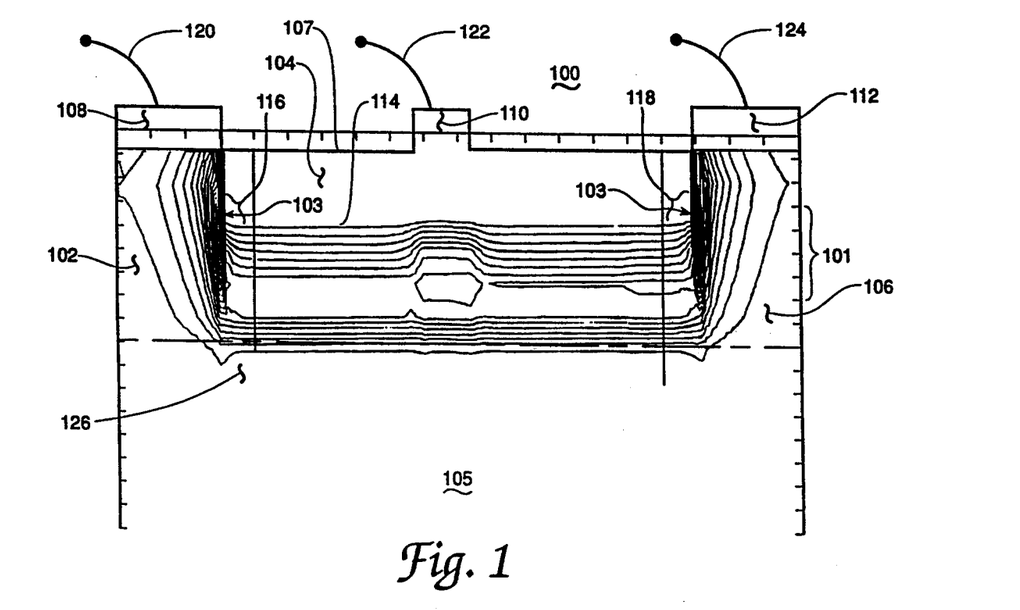
FIG. 1 shows current density contours for a conventional MESFET.

In order to better appreciate the present invention, FIG. 1 of the drawings shows current density contours as are descriptive of the current densities achieved in a conventional MESFET microwave type of transistor during its normal operation. In FIG. 1 the MESFET transistor 100 is shown to include a source region 102, a drain region 106, and a gate or charge channel region 104. The overlaying metal contacts by which electrical potential and current flow are supplied to the source gate and drain of the FIG. 1 transistor are indicated at 108, 110 and 112 respectively and the electrical leads such as bondwires which connect these metal regions to external sources of bias and signal for example, are shown at 120, 122 and 124.

The FIG. 1 MESFET includes an active layer 101 which overlays a buffer layer 126 of lower conductivity and these two layers reside on a substrate material layer 105 which is also of the lower conductivity of the layer 126. The computerized modeling by which the current density contours 114 in FIG. 1 are achieved may be accomplished using the PISCESII-B computer aided design modeling software which is available from Stanford University Software Distribution Center of Stanford Calif.

The FIG. 1 transistor represents a device having an 8 micrometer width and a ½ micrometer depth and is achieved with a gate to source voltage of 0 volts and a drain to source voltage of 0.6 volts; these voltage conditions prevail for the devices of FIGS. 1–4 and FIGS. 7,8 in the present disclosure. The current density contours 114 in FIG. 1 may be considered to be a qualitative representation of conditions occurring during operation of the FIG. 1 transistor. These contours are to be interpreted in the manner of contours of elevation on a military map with each of the successive ones of the illustrated 20 contours representing an increment of change in current density from the adjacent contour. The semiconductor doping levels for the FIG. 1 device are disclosed in the FIG. 3 drawing. These doping levels are indicators of the relative conductivity of the indicated transistor region.

A notable aspect of the FIG. 1 transistor operation is the crowding of the current density contours within the source region 102—as is indicated at 116 and also the similar crowding within the drain region 106—as is indicated at 118. As is represented in FIG. 1 this crowding in the source electrode 102 occurs with greatest density immediately below the metal contact 108 and within the boundary of the source electrode as is indicated at 103. The similar crowding condition 118 in the drain 106 also occurs below the edge of the drain metal contact 112 with a maximum density of $3.35 \times 10^4$ amps per square centimeter being present in the crowding region 103, for example.

For purposes of the present invention it is significant to note that the FIG. 1 MESFET arrangement wherein the source and drain are located in the same level with the gate controlled channel region of the transistor incurs the undesirable crowding of current density contours or high values of current density. Also significant in this conventional MESFET arrangement is the fact that this high current density extends to the surface 107 of the transistor. The transistor 100 therefore incurs the double disadvantage of having high current density near its surface where material imperfections and other surface related phenomena compound the difficulty of a high current density occurrence.

Figure 7:
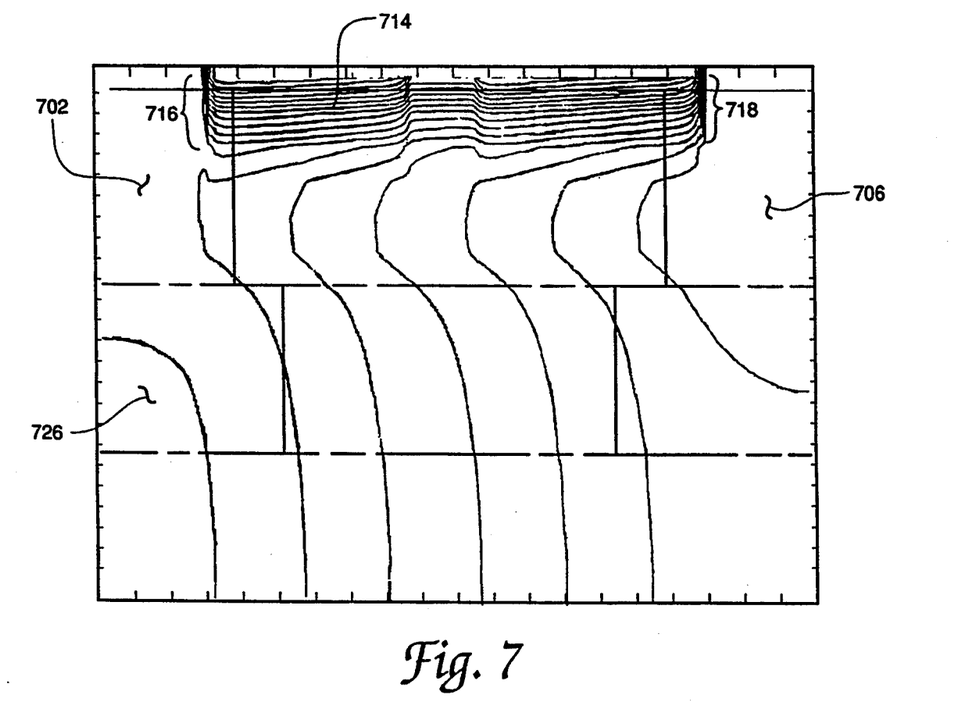
FIG. 7 shows typical constant potential contours for a conventional MESFET.

In addition to this compounded difficulty as is shown in FIG. 7 of the drawings this conventional MESFET structure also suffers from concurrence of the region of high current density with a region of high electric field intensity which extends to the transistor surface.

Figure 2:
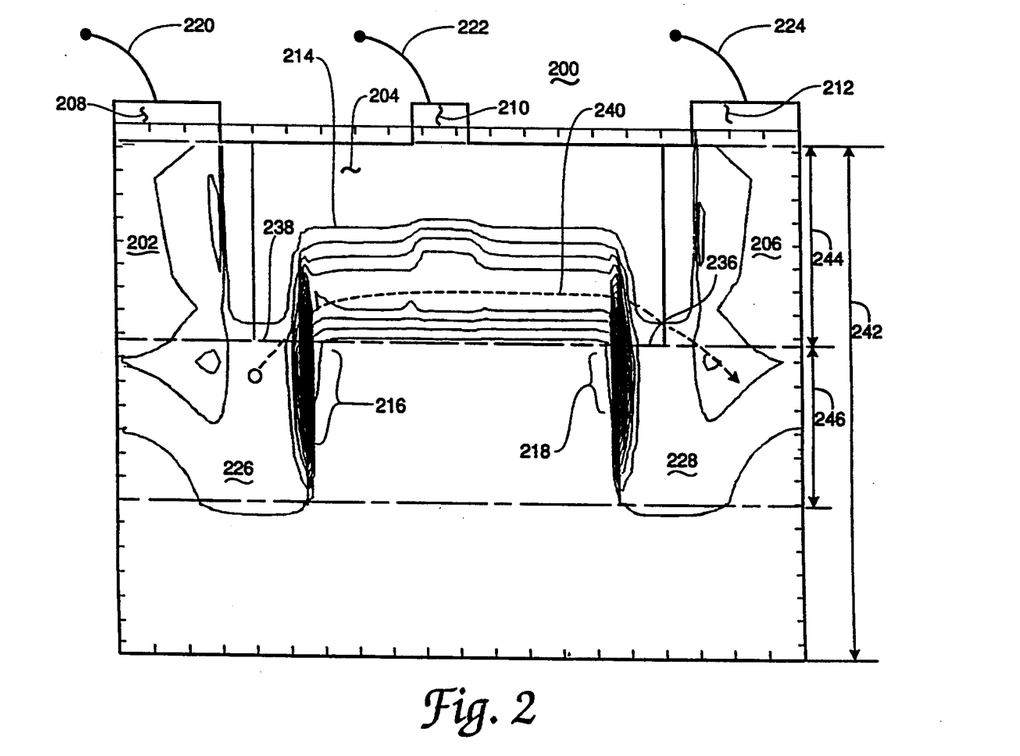
FIG. 2 shows current density contours for a buried source and drain field effect transistor (BSDFET) according to the invention.

FIG. 2 in the drawings shows a FIG. 1 type of current density contour family for a buried source and drain field effect transistor (BSDFET) made in accordance with the present invention. In the FIG. 2 transistor the source and drain electrodes 226 and 228 are located in a buried relationship with respect to the channel region 204. The semiconductor regions 202 and 206 which overlay the source and drain electrodes serve as current conducting connector members by which the current and potential of the metal electrodes 208 and 212 communicate with the source and drain 226 and 228. Other portions of the FIG. 2 transistor are similar to the FIG. 1 device and have similar identification numbers except for the hundreds digit portions of these numbers which are used to indicate the respective drawing figures.

Figure 4:
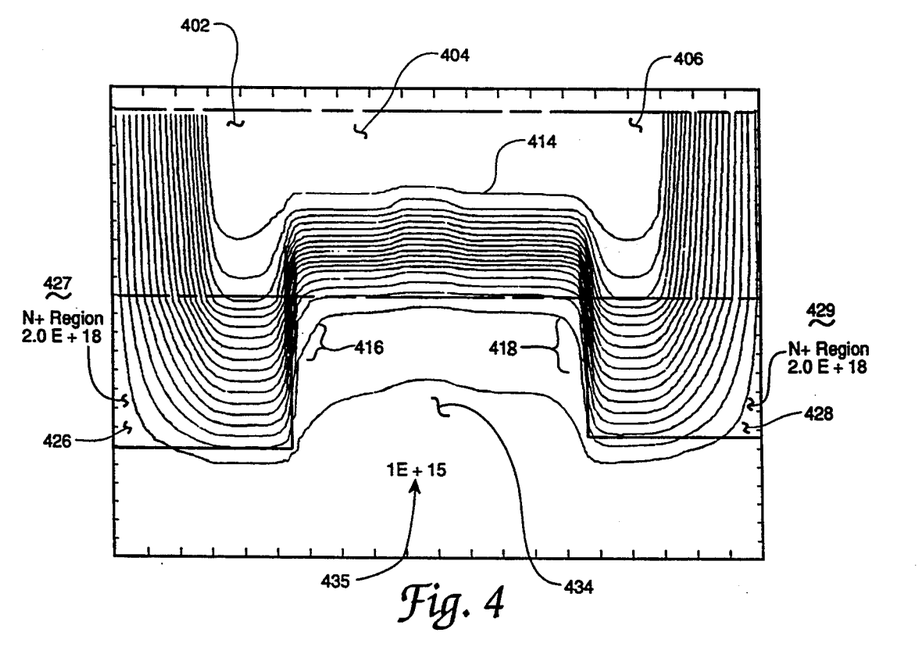
FIG. 4 shows current flow lines for a BSDFET according to the invention.

Doping levels for the FIG. 2 buried source and drain FET are disclosed in the FIG. 4 drawing. As is indicated in this drawing, these source and drain regions are doped to an N+ level in the range of 2E18 atoms per cubic centimeter while the overlaying layer, the layer of the connector members and the charge carrier channel, is doped to the level of 2E17 or to a level of about 1/10 the conductivity of the source and drain regions 426 and 428. The semiconductor region 434 intermediate the source and drain, is as indicated at 435 in FIG. 4, doped to a 1,000 times lesser degree than the source and drain region dopings indicated at 427 and 429 and is for practical purposes an electrically insulating region.

Returning then to FIG. 2, during operation of the FIG. 2 BSDFET a charge carrier movement which is generally along the dotted line path indicated at 240 occurs. This path includes an origin of the charge carriers in the source electrode 226, communication of the charge carriers across a first layer to second layer interface 238, travel in the channel region 204 under the controlling influence of a gate electrode, and then communication across the second layer to first layer interface at 236 into the drain electrode 228. The interfaces at 236 and 238 are, as will be discussed in more detail below, in the form of junctions between an implanted N+ region comprising the source 226 and an epitaxial layer which comprises the channel region 204. The 226 to 238 charge carrier communication is followed by a similar, but reverse direction communication across the interface 236 in this path 240 movement.

In describing the FIG. 2 BSDFET device, as is indicated above, numbers in the 200 series are used with the first or hundreds digit of these numbers indicating the drawing figure in which the number appears and the last two digits indicating an element of the FIG. 2 structure and with these last two digits also being used to indicate similar or related parts in the other drawings of this document to the best degree possible.

The BSDFET in FIG. 2 is shown to incur crowding of current density contours along adjacent edges of the source and drain electrodes 226 and 228, and these crowding regions are indicated generally at 216 and 218 respectively. The crowding of current density contours in the FIG. 2 transistor structure is however, contrasted with that of the FIG. 1 MESFET in two respects. The first contrast is concerned with the location of this crowding, a location which is well within the body of the transistor and removed from the troublesome transistor surface region in the FIG. 2 structure. The second of these contrasts is concerned with the peak value of the current density contour crowding, a peak value of 8.82E+4 amperes per square centimeter being for example identified in the region 218 of FIG. 2.

Although the incurred current density in the FIG. 2 device is greater than that of the FIG. 1 MESFET, the location of this high current density well within the body of the BSDFET structure of FIG. 2 is a significant improvement over the surface location of high current density regions in the FIG. 1 MESFET structure. Such location is of course, a significant advantage of the herein disclosed BSDFET device structure.

As indicated in the above description relating to FIG. 1, the overall thickness dimension 242 of the transistor structure shown herein is preferably in the order of one-half micrometer. Each of the thicknesses 244 and 246 for the first and second layer portions of the FIG. 2 transistor are preferably in the range of 0.2 micrometer.

Figure 3:
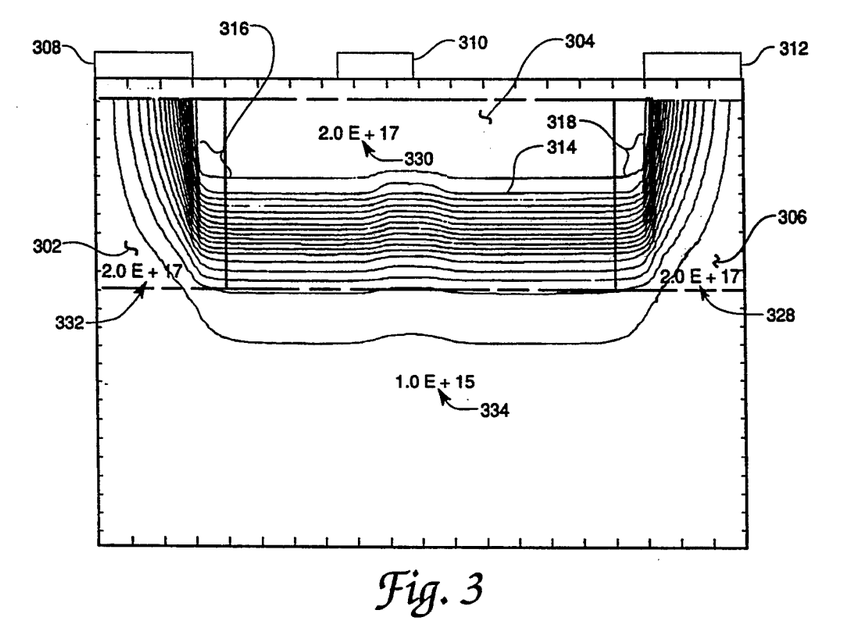
FIG. 3 shows current flow lines for a conventional MESFET.

The typical FIG. 3 flow line 314 in its fullest extent indicates the path of currents flowing from the source related metal header 308 to the drain related metal header 312 in a FIG. 1 type of conventional MESFET device. The FIG. 3 drawing also indicates the doping levels to be expected in the source region 302, channel or gate region 304, and drain region 306 of the conventional MESFET device shown in FIG. 1 and FIG. 3. In summary the 2E17 higher level of doping is used in the top-most layer of the MESFET and a lower almost insulating level of 1E15 used in the first and underlying second layer of the MESFET device.

For purposes of the present invention it is significant to note that high current density, as represented by closely spaced current flow lines, exists at and near the surface of the FIG. 3 conventional MESFET device. In contrast, FIG. 4 of the drawings shows the flow line and doping level information, as disclosed in FIG. 3 for the conventional MESFET device, for the case of the buried source and drain transistor of the present invention. As indicated in FIG. 4 the buried source and drain regions 426 and 428 in FIG. 4 are most highly doped, to the level of 2E+18 atoms per cubic centimeter while the channel region 404, as well as the connector members 402 and 406, that is, the entire second layer of FIG. 4 BSDFET device, is doped to the lower 2E+17 atoms per cubic centimeter level as is indicated at 40.7. The current crowding regions 416 and 418 of the FIG. 4 device are disclosed in connection with FIG. 2 above to be located well within the body of the FIG. 4 device and away from the transistor surface regions as is desired in accordance with the present invention.

Figure 5:
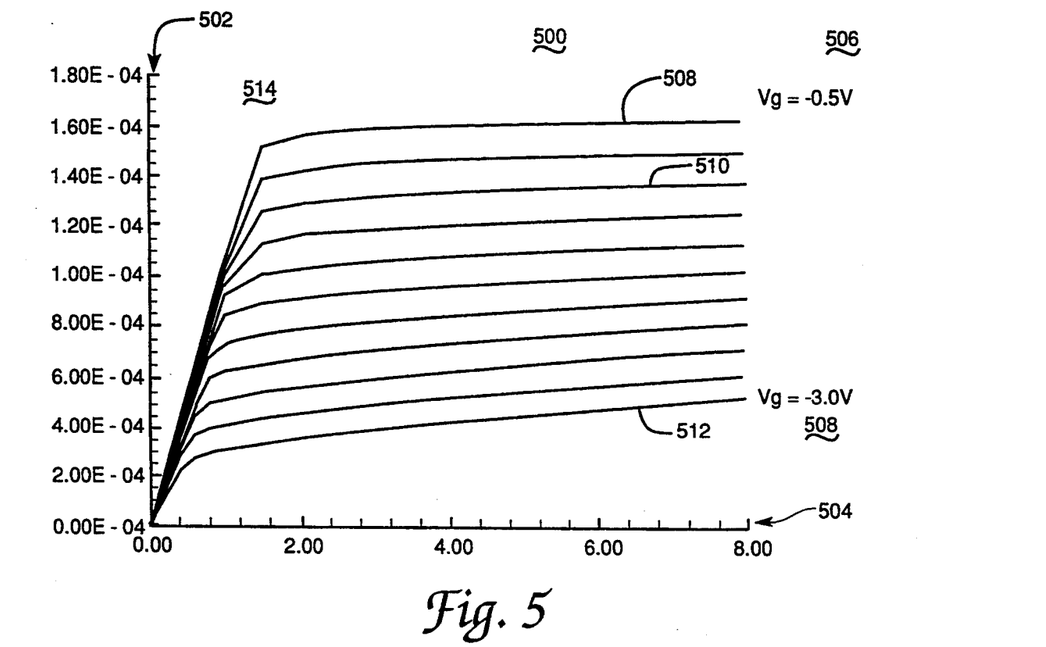
FIG. 5 shows typical current vs. voltage characteristics for a conventional MESFET.
Figure 6:
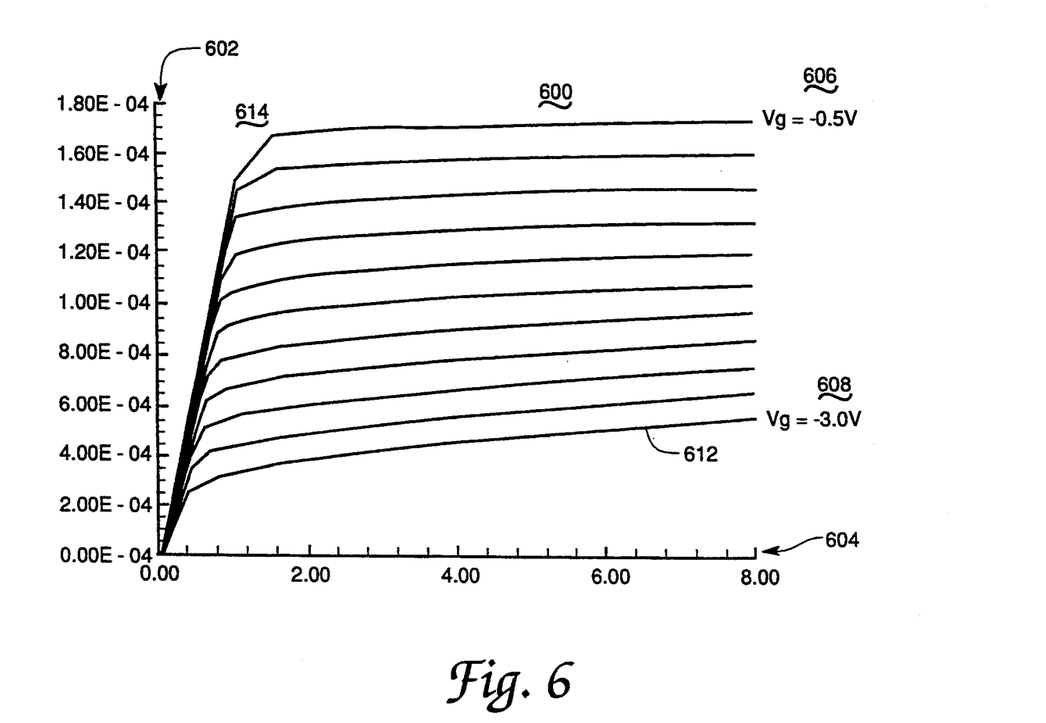
FIG. 6 shows typical current vs. voltage characteristics for a BSDFET.

FIGS. 5 and 6 in the drawings provide yet another comparison between the conventional MESFET semiconductor device and the buried source and drain field effect transistor of the present invention. FIG. 5 shows the current vs. voltage characteristics for a typical FIG. 1 MESFET semiconductor device. In the FIG. 5 drawing current values between 0 and 180 microamperes are plotted along the vertical axis 502 while voltages between 0 and 8 volts are plotted along the horizontal axis 504. Each of the more or less constant current characteristic curves 508 and 510 for example, represents a differing value of gate to source voltage for the MESFET device. The curve 508 represents a gate to source voltage of minus 0.5 volts as is indicated at 506 in FIG. 5 while each of the succeeding curves represents a one-quarter volt more negative value of this gate to source voltage. The curve 510, for example, represents a gate to source voltage of −1.0 volts and the curve 512 represents a gate to source voltage of −3.0 volts as is indicated at 509. The substantially linear rise from the origin of the FIG. 5 curves to a knee voltage at 514 followed by changeover to the constant current characteristic of the curve 508 is known for field effect transistors in general and is of course strikingly similar to the characteristics of a pentode vacuum tube, as has been noted in the art.

FIG. 6 in the drawings shows a family of curves of the FIG. 5 type for the buried source and drain field effect transistor of the present invention. As indicated by the correspondingly numbered parts in FIG. 6, The FIG. 6 curves are similar to those of the conventional MSFET device with the most notable difference being a somewhat lower knee voltage at the transition point between linear voltage increase and constant current characteristics, at the knee 614 in FIG. 6. The somewhat lower knee voltage of the BSDFET device is of course desirable in some uses of the transistor since higher direct current energy to radio frequency energy conversion efficiency and lower loss utilization circuits can thereby be achieved.

Figure 8:
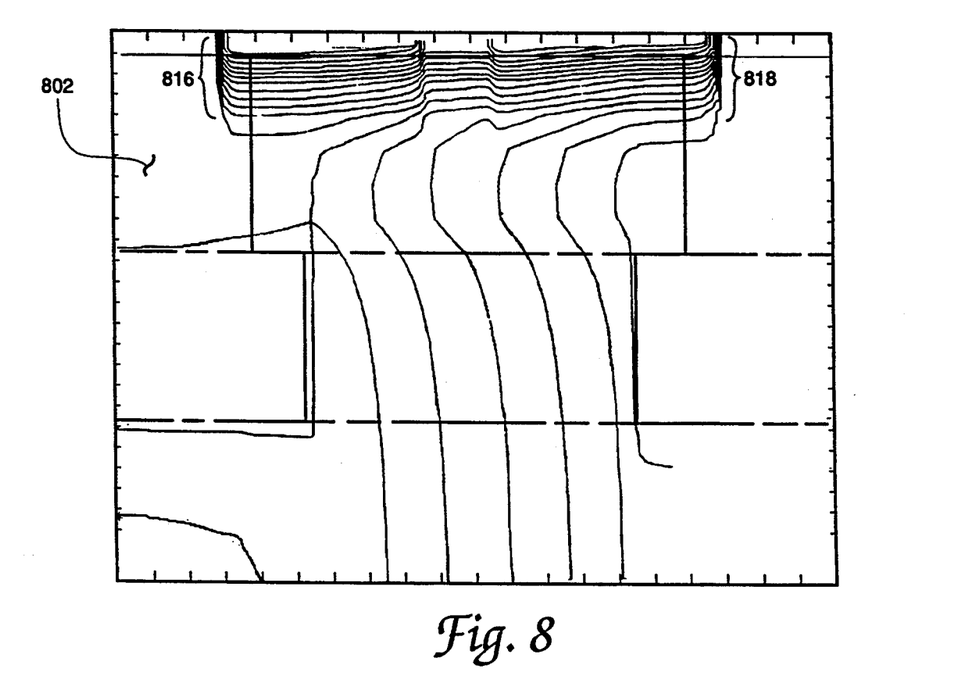
FIG. 8 shows typical constant potential contours for a BSDFET.

FIGS. 7 and 8 in the drawing show yet another comparison between the conventional MESFET device and the BSDFET of the present invention. In these drawings each line represents a contour of constant electrical potential. The overall effect of these curves is to indicate regions of high electric field intensity in the MESFET and BSDFET. As is expected, the regions of highest electric field intensity occur near the surface of the FET device in both the FIG. 7 and FIG. 8 devices. It is significant to note however that the regions of highest electric field intensity in the FIG. 8 buried source and drain field effect transistor are not coincident with the regions of high current density as has been shown in the drawing of FIG. 2 above. This desirable relationship between the FIG. 8 and FIG. 2 drawings is of course not achieved with the conventional MESFET device as is readily apparent by comparing the location of greatest electric field intensity in FIG. 7 with the similar location of high current density in FIG. 1.

The absence of coincident high current density and large electric field intensity especially at the transistor surface is found to be of material benefit in reducing surface related difficulties with the BSDFET of the present invention. The absence of current crowding in the regions of high potential gradient for the BSDFET of the present invention also means that the product of current and voltage drop is minimized in the crowding region so that greatly reduced power dissipation near the surface of the device results. This reduced surface area dissipation in turn limits the current associated breakdown effects in the device.

FIGS. 9A, 9B, 9C, 9D, and 9E in the drawings show the salient steps in a fabrication sequence for the buried source and drain field effect transistor of the present invention. This fabrication is accomplished in the five major steps indicated at 900, 902, 904, 906 and 908 in FIGS. 9A, 9B, 9C, 9D, and 9E, respectively with each succeeding of the steps in this sequence of figures accomplishing an additional activity in the fabrication sequence. Gallium arsenide is the preferred semiconductor material for the present transistor's fabrication.

Other materials such as indium phosphide, silicon carbide, carbon, and of course, silicon and germanium may alternately be employed.

Figure 9A:
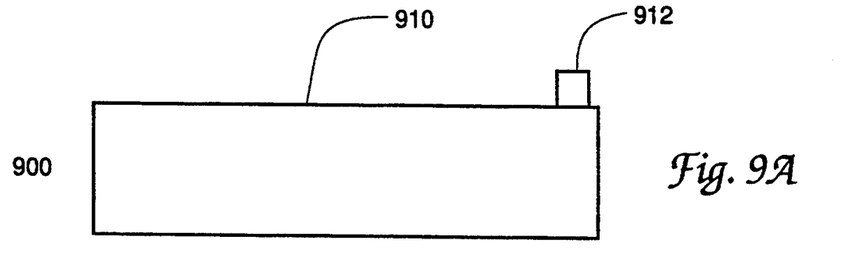
FIGS. 9A, 9B, 9C, 9D and 9E show a fabrication sequence for BSDFET according to the invention.

In the FIGS. 9A step at 900, a semi-insulating substrate member 910 of a material such as gallium arsenide is provided with an alignment mark 912 in order that location and registration of succeeding portions of the finished transistor can be accurately accomplished. At 902 in FIGS. 9B N+ regions which will serve as the source and drain of the BSDFET device have been implanted at 914 and 916. These source and drain areas have been covered with an epitaxial layer 918 in the step 904 of FIG. 9C. The layer 918 is typically of two tenths micrometers thickness and is composed of N-doped semiconductor having an $N_d$ of 2E17. This doping level is also indicated at 407 and 409 in the layer 918—corresponding material at 404 in FIG. 4. The significantly lower doping level of the material at 434 in FIG. 4 is indicated as N— at 411 in FIG. 4. At 906 in FIGS. 9D the active region 920 of the BSDFET has been defined by way of etching or alternately by implant isolation. In the step 908 of FIGS. 9E the metal contacts 924, 926, and 928 for the source, gate, and drain of the transistor have been added.

Figure 9B:
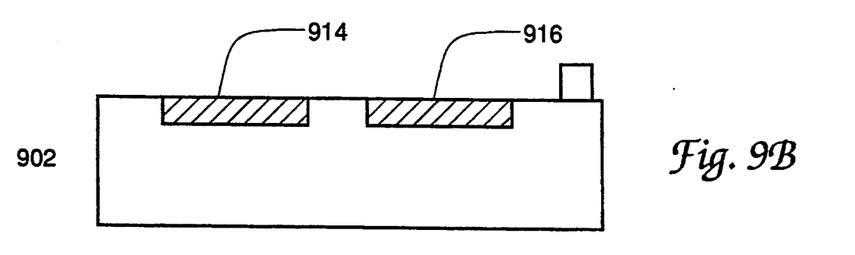
Figure 9C:
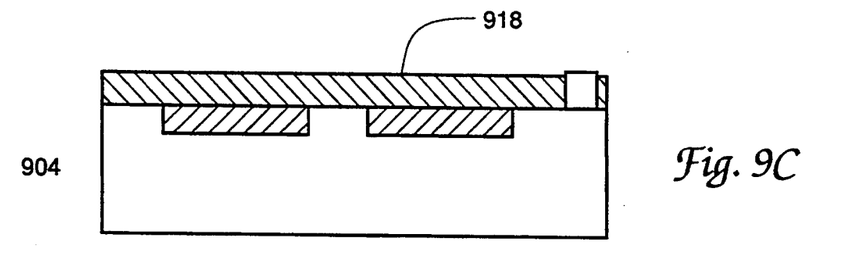
Figure 9D:
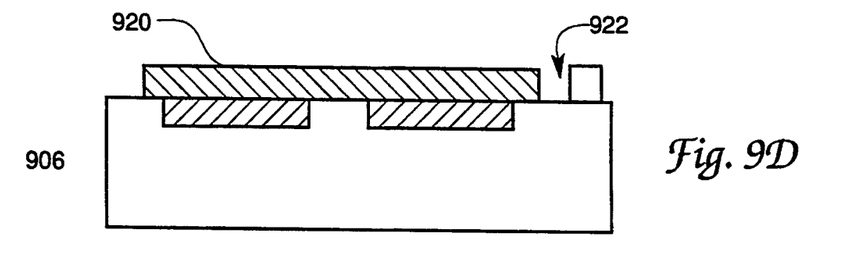
Figure 9E:
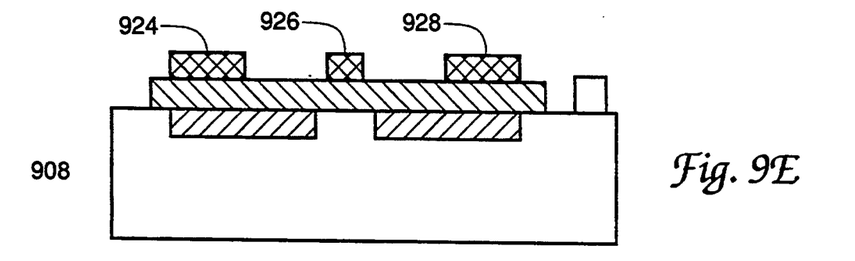

Common knowledge in the semiconductor fabrication art indicates that a precise determination of the lateral dimension for regions such as the source and drain of the present invention BSDFET in the step 902, the regions 914 and 916 in FIG. 9B, is accomplished with some difficulty. Available conventional fabrication techniques such as diffusion and implanting do not in fact lead to precise lateral dimension determinations. The newly emerging technique of organo-metallic vapor phase epitaxy (omvpe) is however understood to provide capabilities which are consistent with the fabrication sequence defined in FIGS. 9A, 9B, 9C, 9D, and 9E. Techniques using focused ion beam element growth are also of interest with respect to fabricating the present invention transistor.

The buried source and drain field effect transistor of the present invention therefore retains the desirable features of a microwave MESFET yet removes problems related to current crowding near the device surface. The concepts described for the invention are not limited to microwave transistor devices, however, the necessary small physical size for microwave transistors and the resulting current path crowding within these devices makes such microwave transistors particularly amenable to benefits of the invention.

The invention moreover allows the device of given physical size to operate at higher voltages and greater power densities enabled by the bulk properties of semiconductor materials such as GaAs—and other semiconductor materials. In contrast with a standard MESFET where large potential drops occur in coincidence with intense current crowding, in the present device current crowding is moved away from the surface and positioned away from drops in potential. This results in lowered power dissipation at the surface and improved transistor reliability.

Current densities near the surface of 3.35E+4 (AMPS/CM2) are common for the MESFET and approximately 1.3E+4 (AMPS/CM2) for the BSDFET design. This translates into a 61% reduction in both current crowding and power dissipation at the surface. In the BSDFET design the peak current crowding is in the device's semiconductor bulk and at an area of low potential. The peak power dissipation in this area is in fact approximately 13% as much as the peak power dissipation in the area of the surface of the MESFET. Similar relationships occur at other bias conditions.

While the apparatus and method herein described constitute a preferred embodiment of the invention, it is to be understood that the invention is not limited to this precise form of apparatus or method, and that changes may be made therein without departing from the scope of the invention, which is defined in the appended claims.

We claim:

1. Low surface current density buried source and drain metal semiconductor field effect transistor apparatus of physically segregated high intensity electric field location and high current density location comprising the combination of:

a semi-insulating semiconductor substrate member;

source and drain members formed in said substrate member and physically separated from each other, said source and drain members being comprised of said semi-insulating semiconductor substrate material having a first and highest concentration of a first dopant material disposed therein;

an active layer of semiconductor material, including a second dopant material at a second and lower concentration, disposed over said substrate member and said source and drain members therein, with portions of said active layer of semiconductor material contiguous said source and drain members comprising source current conducting and drain current conducting connector members respectively;

an intermediate region of said active layer of semiconductor material, a region between said source and drain connector members, comprising in a lowermost potion thereof, a gate controlled carrier transport channel region for charge carriers flowing between said source and drain members of said transistor;

source metal contact and drain metal contact members each located on a respective one of said source current and drain current conducting connector members and in contiguous connection therewith;

a gate metallic contact member located on a gate element portion of said carrier transport channel region of said semiconductor material layer; and means for electrically connecting said metallic contact members with externally disposed sources of electrical energy, signal source, and signal utilization.

2. The transistor apparatus of claim 1 wherein said substrate member and said layer of semiconductor material are comprised of semiconductor materials taken from the group consisting of gallium arsenide, indium phosphide, silicon carbide, carbon, silicon, and germanium.

3. The transistor apparatus of claim 1 wherein said transistor is a microwave power amplifier transistor.

4. The transistor apparatus of claim 1 wherein said source and drain members have physical extent dimensions and physical separation distances between one micron and ten microns and between 0.5 micron and 5 microns, respectively.

5. The transistor apparatus of claim 1, wherein said semiconductor material is comprised of gallium arsenide.

6. The transistor apparatus of claim 5 wherein said source and drain members comprise N+ implant regions having a thickness of between 0.05 and 0.5 micron.

7. The transistor apparatus of claim 5 wherein said source and drain members comprise N+ regions of said transistor and include an electron donor dopant material.

8. The transistor apparatus of claim 7 wherein said source and drain member dopant material has a concentration between $1E17/cm^3$ and $1E19/cm^3$.

9. The transistor apparatus of claim 7 wherein said dopant material is silicon.

10. The transistor apparatus of claim 5 wherein said active layer of semiconductor material has a thickness between 0.05 micron and 0.5 micron.

11. The transistor apparatus of claim 5 wherein said active layer of semiconductor material includes an electron donor dopant material.

12. The transistor apparatus of claim 11 wherein said dopant material has a concentration between $1E16/cm^2$ and $1E18/cm^2$.

13. The transistor apparatus of claim 5 wherein said intermediate region has length and thickness dimensions between 0.5 micron and 5 microns; and 0.05 micron and 0.5 micron, respectively.

14. The transistor apparatus of claim 13 wherein said dopant material is silicon.

15. The surface effects immune method for operating a metal-semiconductor field effect transistor comprising the steps of:
   establishing N+ doped source and drain electrode elements for said transistor in a lowermost first substrate layer portion thereof;
   forming a source electrode to drain electrode charge flow channel within a N-doped second layer portion of said transistor, said second layer portion being contiguously disposed over said lowermost first substrate layer portion of said transistor and forming a lowermost first substrate layer to second layer interface therewith;
   enabling a first trans-layer flow of charge carriers, originating in said source electrode of said lowermost first substrate layer, across said lowermost first substrate layer to second layer interface and into a lowermost region of said second layer, said first trans-layer flow comprising a first portion of a source electrode to drain electrode charge carrier flow within said transistor;
   establishing a second trans-layer flow of said first trans-layer flow charge carriers, from said lowermost region of said second layer across a drain electrode-adjacent second layer to lowermost first substrate layer interface, and into said drain electrode, said second trans-layer flow comprising a second portion of said source electrode to drain electrode charge carrier flow in said transistor; and
   modulating said source electrode to drain electrode charge carrier flow, said modulating including applying a controlling electrical potential to a gate electrode that is located adjacent a third layer transistor portion contiguously disposed over said second layer portion.

16. The method of claim 15 further including the step of establishing source current conducting and drain current conducting connector regions in said second layer portion of said transistor in overlaying relationship with said source and drain members.

17. The method of claim 16 wherein said communicating step includes charge carrier flow across said first layer to second layer interface into said gate electrode controlled charge flow channel region of said second layer portion.

18. The method of claim 17 wherein said transporting step includes charge carrier flow from said gate electrode controlled charge flow channel region to said drain electrode element.

19. The method of claim 16 further including the steps of communicating bias potentials and signals into said transistor via metal electrodes resident adjacent said third layer and adjacent said source current conducting and drain current conducting connector regions of said second layer transistor portion.

* * * * *